(12) United States Patent
Huang et al.

(10) Patent No.: US 8,040,188 B2
(45) Date of Patent: Oct. 18, 2011

(54) LOW NOISE CASCODE AMPLIFIER

(75) Inventors: Bo-Jr Huang, Taipei (TW); Huei Wang, Taipei (TW)

(73) Assignee: National Taiwan University, Taipei (TW)

( * ) Notice: Subject to any disclaimer, the term of this patent is extended or adjusted under 35 U.S.C. 154(b) by 27 days.

(21) Appl. No.: 12/457,927

(22) Filed: Jun. 25, 2009

(65) Prior Publication Data

US 2010/0264988 A1 Oct. 21, 2010

(30) Foreign Application Priority Data

Apr. 17, 2009 (TW) ................ 98112792 A

(51) Int. Cl.
*H03F 1/22* (2006.01)
(52) U.S. Cl. ....................................... 330/311
(58) Field of Classification Search .......... 330/277, 330/302, 311
See application file for complete search history.

(56) References Cited

U.S. PATENT DOCUMENTS

| | | | |
|---|---|---|---|
| 4,586,004 A * | 4/1986 | Valdez | 330/300 |
| 6,522,195 B2 | 2/2003 | Watanabe et al. | |
| 6,556,085 B2 * | 4/2003 | Kwon et al. | 330/311 |
| 2006/0103468 A1 | 5/2006 | Su et al. | |
| 2006/0267682 A1 * | 11/2006 | Grebennikov | 330/51 |
| 2007/0285175 A1 * | 12/2007 | Oh et al. | 330/311 |
| 2010/0259331 A1 * | 10/2010 | Duster et al. | 330/305 |

FOREIGN PATENT DOCUMENTS

TW 200816624 4/2008
TW 200820589 5/2008

* cited by examiner

*Primary Examiner* — Steven J Mottola
(74) *Attorney, Agent, or Firm* — Rosenberg, Klein & Lee

(57) ABSTRACT

The present invention relates to a low noise cascode amplifier comprising a first transistor, a second transistor, a third transistor, a first inductor, and a second inductor. Furthermore, the first transistor can connect with the second transistor via the first inductor, and the second transistor can connect with the third transistor via the second inductor; thereby, a cascode device can be formed. The inductor and the parasitic capacitances can resonate at high frequency, so that the noise figure of the cascode amplifier can be reduced.

11 Claims, 9 Drawing Sheets

LOW NOISE CASCODE AMPLIFIER

BACKGROUND OF THE INVENTION

1. Technical Field

The present invention generally relates to cascade amplifier, and more particularly to low noise cascade amplifier.

2. Description of the Prior Art

The integrated circuit always comprises an amplifier circuit for amplifying an input signal. In general, the metal-oxide semiconductor device (MOS) or the cascode can be the amplifier circuit. Referring to FIG. 1, what is shown is a circuit diagram for the MOS as an amplifier according to the prior art. The amplifier comprises a MOS M1 and a current source I, wherein the source of the MOS M1 is grounded, the gate of the MOS M1 connects to a bias voltage VI, and the drain of the MOS M1 connects to the current source I to form a common source MOS. Although the MOS M1 can be used to amplify the input signal, the resulting gain is always too low to be a fine amplifier, and leads to the limited application of the amplifier.

Referring to FIG. 2, what is shown is a circuit diagram for a cascode device according to the prior art. The cascode device 10 comprises a common source transistor M1 and a common gate transistor M2, and the gain of the cascode device 10 is higher than the common source MOS as shown in FIG. 1.

In addition, the triple cascode device 20 comprises three transistors in series to improve the gain. As shown in FIG. 3, the triple cascode device 20 comprises a common source transistor M1, a common gate transistor M2, and a common gate transistor M3.

Referring to FIG. 4, what is shown is a gain-frequency diagram for a cascode device and a triple cascode device according to the prior art. In this embodiment, the transistor M1 is a 16-finger NMOS with a total gate width of 40 um, the transistor M2 is a 24-finger NOMS with a total gate width of 60 um, and the transistor M3 is a 32-finger NMOS with a total gate width of 80 um. Furthermore, the dashed line is the curve of the gain (MSG/MAG)-frequency of the triple cascade device 20, and the continuous line is the curve of the gain (MSG/MAG)-frequency of the cascode device 10, as shown in FIG. 4, wherein the MSG is the maximum stable gain, and the MAG is the maximum available gain.

The MSG of the triple cascade device 20 is 21.5 dB, and the MSG of the cascode device 10 is 15.3 dB, while the operating frequency is 40 GHz. In another words, the gain of the triple cascade device 20 is higher than that of the cascode device 10 or the common source MOS. Moreover, the triple cascode device 20 has the following advantages: high input impedance, high output impedance, high gain, compact size, and so forth.

Although the triple cascode device 20 provides the above advantages, it also produces noise, which limits the application of the triple cascode device 20. Referring to FIG. 5, what is shown is a noise-frequency diagram for a cascode device and a triple cascade device according to the prior art. The dashed line is the curve of the noise ($Nf_{min}$, minimum noise figure)-frequency of the triple cascade device 20, and the continuous line is the curve of the noise ($Nf_{min}$)-frequency of the cascode device 10.

The $Nf_{min}$ of the triple cascade device 20 is 3.5 dB, and the $Nf_{min}$ of the cascode device 10 is 2.8 dB, while the operating frequency is 40 GHz. Therefore, the triple cascade device 20 cannot be a suitable low noise amplifier (LNA) for a wireless transceiver due to its high noise figure.

SUMMARY OF THE INVENTION

It is a feature of the present invention to provide a low noise cascode amplifier, wherein the cascode device comprises at least one inductor for reducing the noise figure of the cascode device, so that the cascode device can be used as a low noise cascode amplifier.

It is another feature of the present invention to provide a low noise cascode amplifier, wherein the inductor(s) within the cascode device and the parasitic capacitance(s) can be incorporated together to become a resonator, thusly resulting in the noise reduction of the cascode device and the improved stability thereof.

It is still another feature of the present invention to provide a low noise cascode amplifier, wherein the inductance of the inductor(s) can be adjusted according to the value of the parasitic capacitance, resulting in the high frequency noise being reduced.

It is still another feature of the present invention to provide a low noise cascode amplifier, wherein the inductance of the inductor(s) can be adjusted according to the operating frequency of the cascode device to reduce the noise figure of the low noise cascode amplifier being operated at a designated frequency.

According to the above features, a low noise cascode amplifier includes the followings: a first transistor; a first inductor connected to the first transistor; a second transistor connected to the first inductor; a second inductor connected to the second transistor; and a third transistor connected to the second inductor.

According to the above features, another low noise cascade amplifier comprises the following: a cascode device comprising three or more than three transistors in series; and at least one inductor positioned between the adjacent transistors.

The present invention can be best understood through the following description and accompanying drawings.

DETAILED DESCRIPTION OF THE PREFERRED EMBODIMENTS

Figure 6:
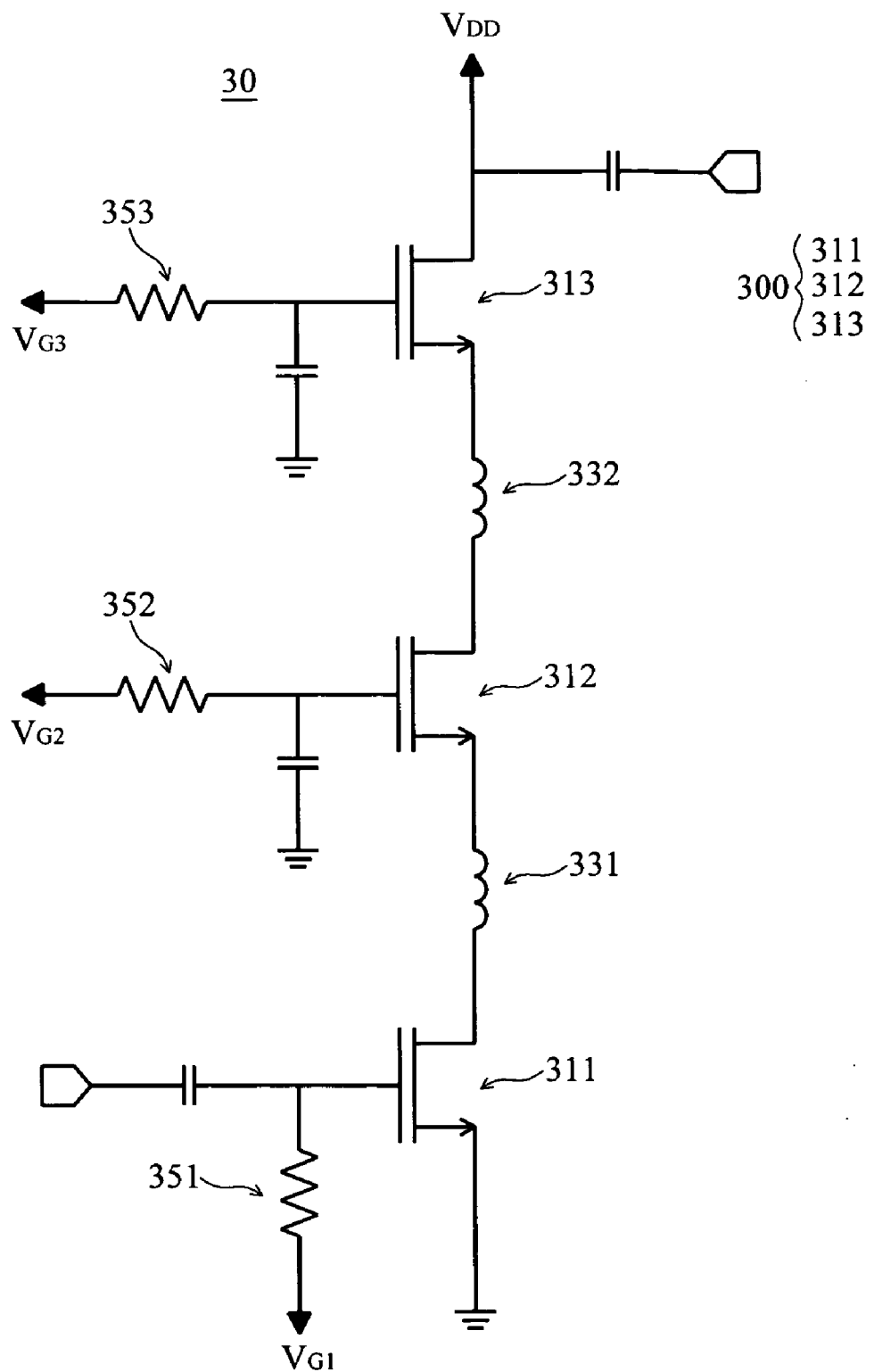
FIG. 6 is a circuit diagram for the low noise cascode amplifier according to an embodiment of the present invention.

Referring to FIG. 6, disclosed is a circuit diagram for a low noise cascode amplifier according to an embodiment of the present invention. The low noise cascode amplifier 30 comprises a first transistor 311, a second transistor 312, a third transistor 313, a first inductor 331, and a second inductor 332, wherein the noise figure can be reduced via the application of the inductors.

The series connection of the first transistor 311, the second transistor 312, and the third transistor 313 can form a cascode device, such as a triple cascode device 300. The triple cascode device 300 is usually provided within various kinds of amplifiers, because of the advantages associated with high input impedance, high output impedance, high gain, and compact size.

However, the triple cascode device 300 cannot be considered a suitable low noise amplifier (LNA) for a wireless transceiver due its high noise figure. In the embodiment of the invention, the cascode device comprises at least one inductor to reduce the noise figure. For example, the cascode device comprises three or more transistors in series. Moreover, at least one inductor can be provided between the adjacent transistors in order to reduce the noise figure of the cascode device.

The first transistor 311 connects to the first inductor 331 and the second transistor 312 via the first inductor 331. The second transistor 312 connects to the second inductor 332 and the third transistor 313 via the second inductor 332. For example, the first transistor 311, the second transistor 312, and the third transistor 313 can be the NMOS, and the drain of the first transistor 311 can be connected to the source of the second transistor 312 via the first inductor 331. The drain of the second transistor 312 can be connected to the source of the third transistor 313 via the second inductor 332.

The first transistor 311 can be a common source metal-oxide semiconductor device, and the second transistor 312 and the third transistor 313 can be a common gate metal-oxide semiconductor device.

The parasitic capacitance will be generated as the first transistor 311, the second transistor 312, and the third transistor 313 operate at high frequency. For example, referring to FIG. 7, a first parasitic capacitance Cp1 is generated at the node N1 between the first transistor 311 and the first inductor 331, a second parasitic capacitance Cp2 is generated at the node N2 between the first inductor 331 and the second transistor 312, a third parasitic capacitance Cp3 is generated at the node N3 between the second transistor 312 and the second inductor 332, and a fourth parasitic capacitance Cp4 is generated at the node N4 between the second inductor 332 and the third transistor 313.

Figure 1:
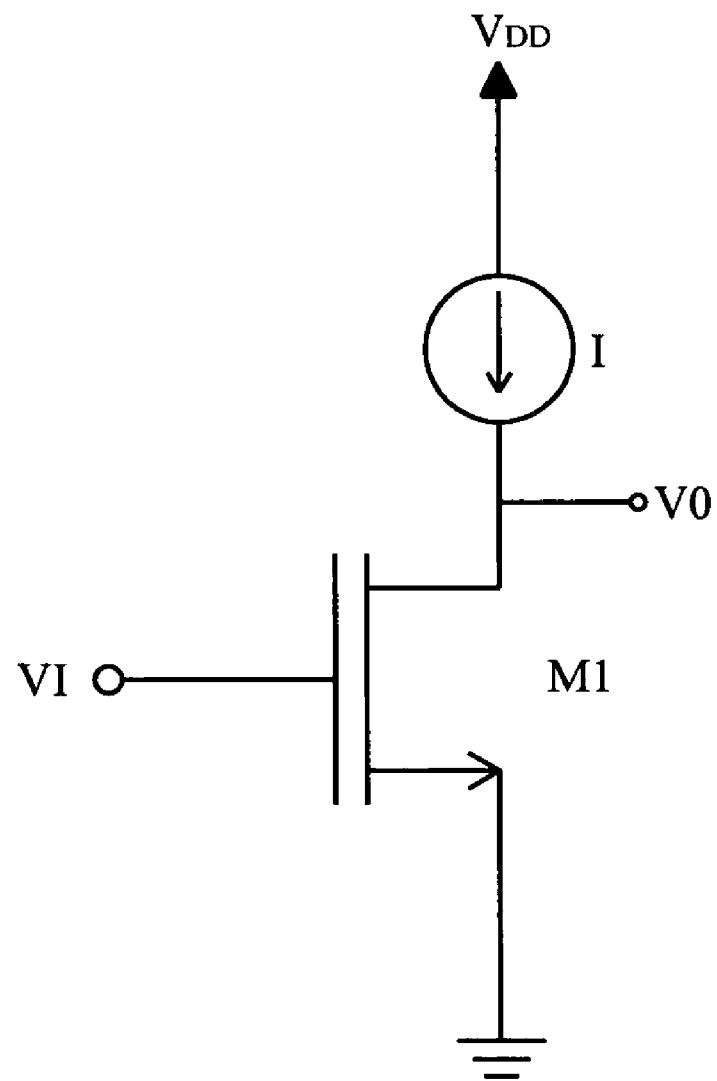
FIG. 1 is a circuit diagram of the MOS as an amplifier according to the prior art.
Figure 2:
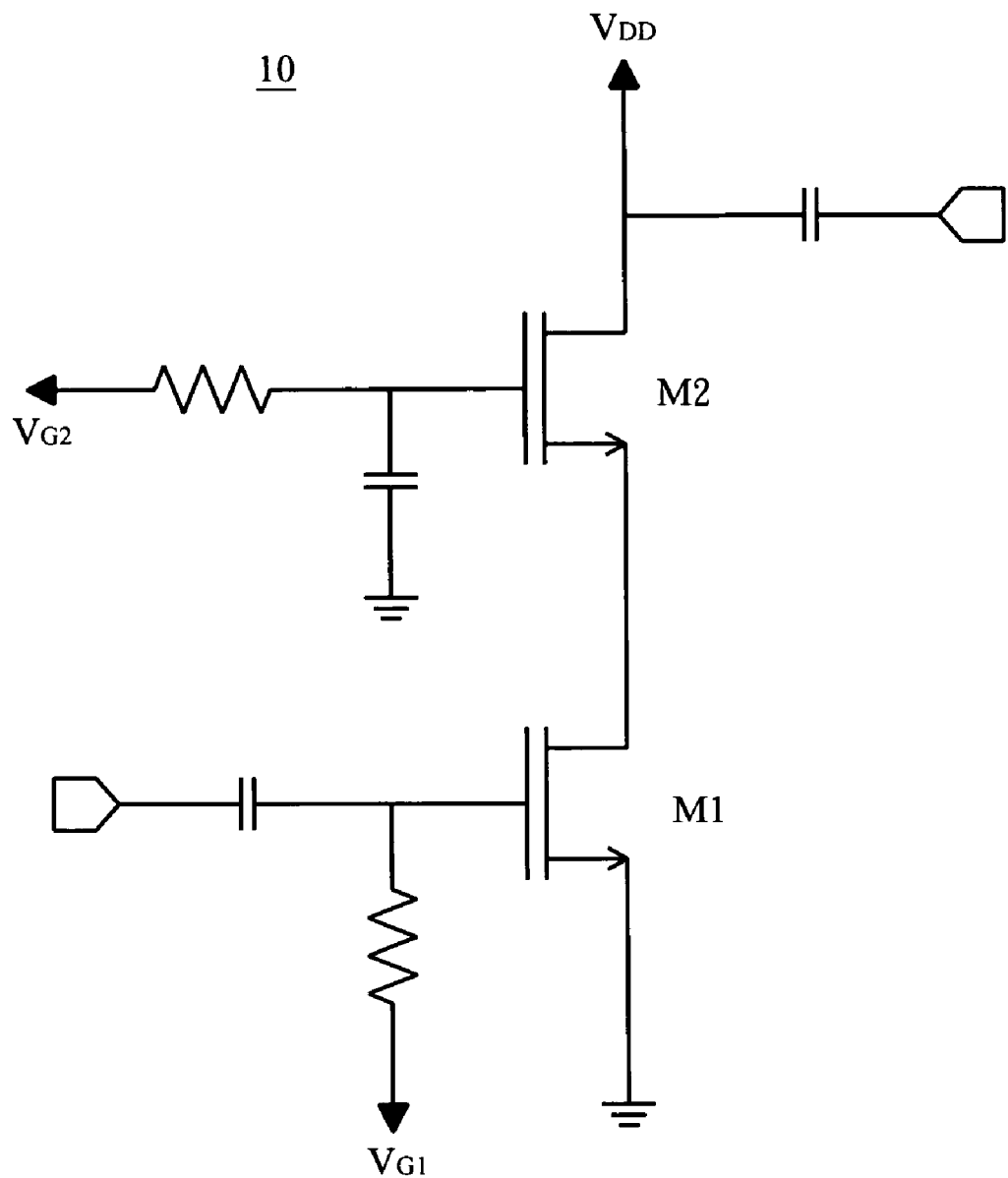
FIG. 2 is a circuit diagram for a cascode device according to the prior art.
Figure 3:
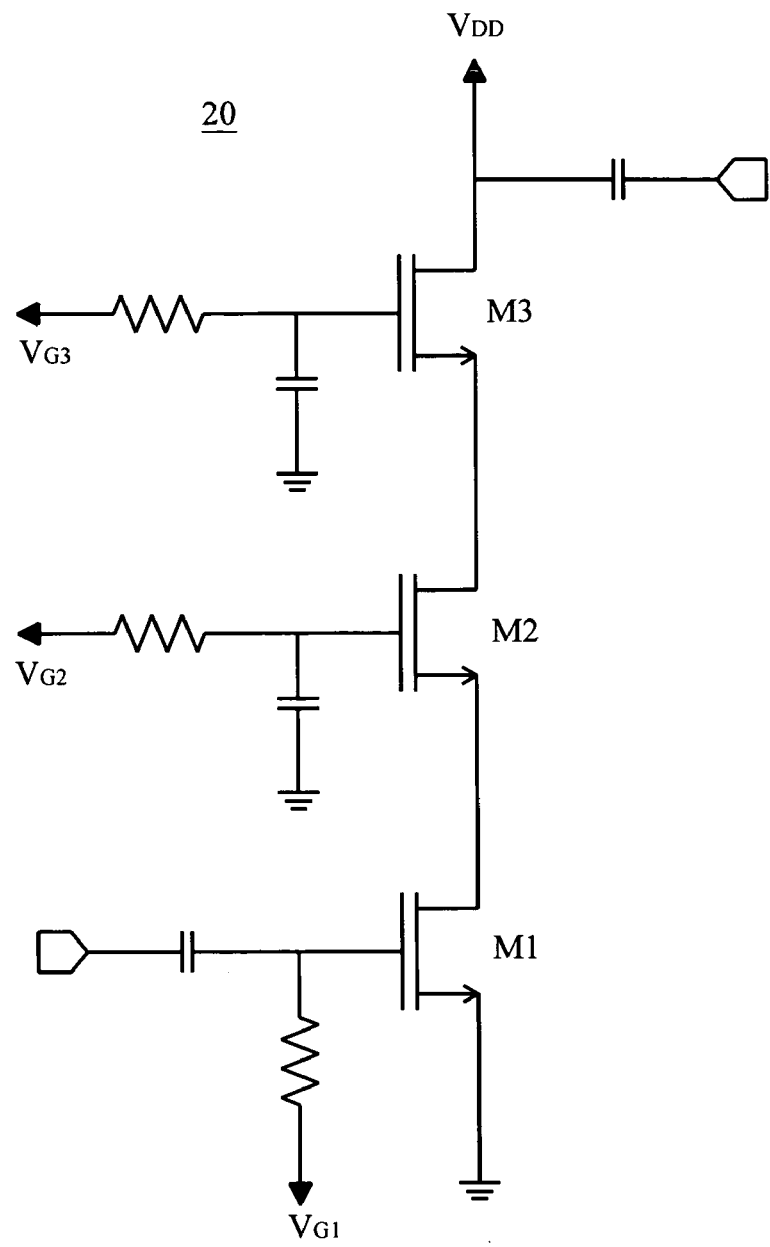
FIG. 3 is a circuit diagram for a triple cascode device according to the prior art.
Figure 4:
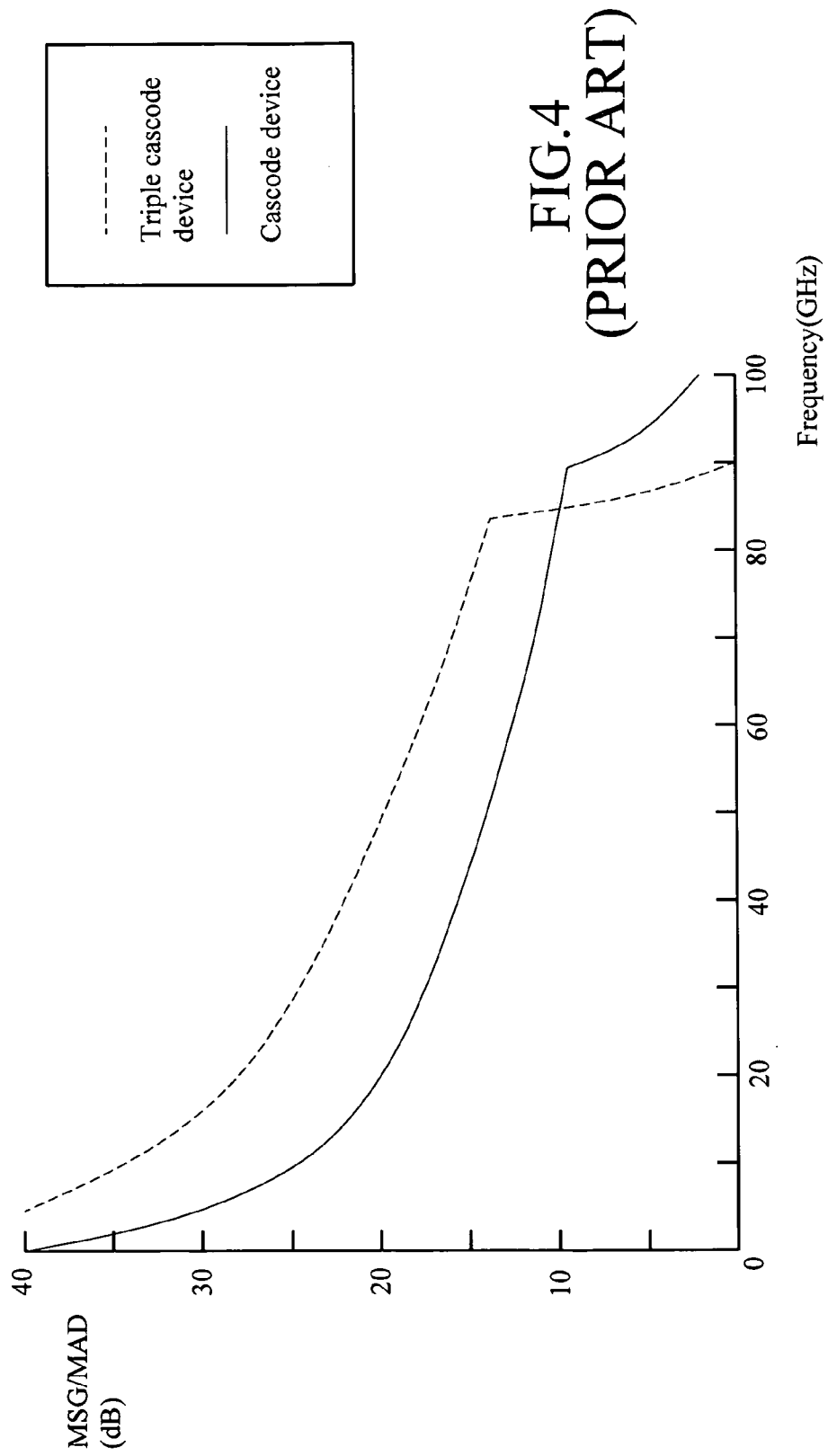
FIG. 4 is a gain-frequency diagram for a cascade device and a triple cascade device according to the prior art.
Figure 5:
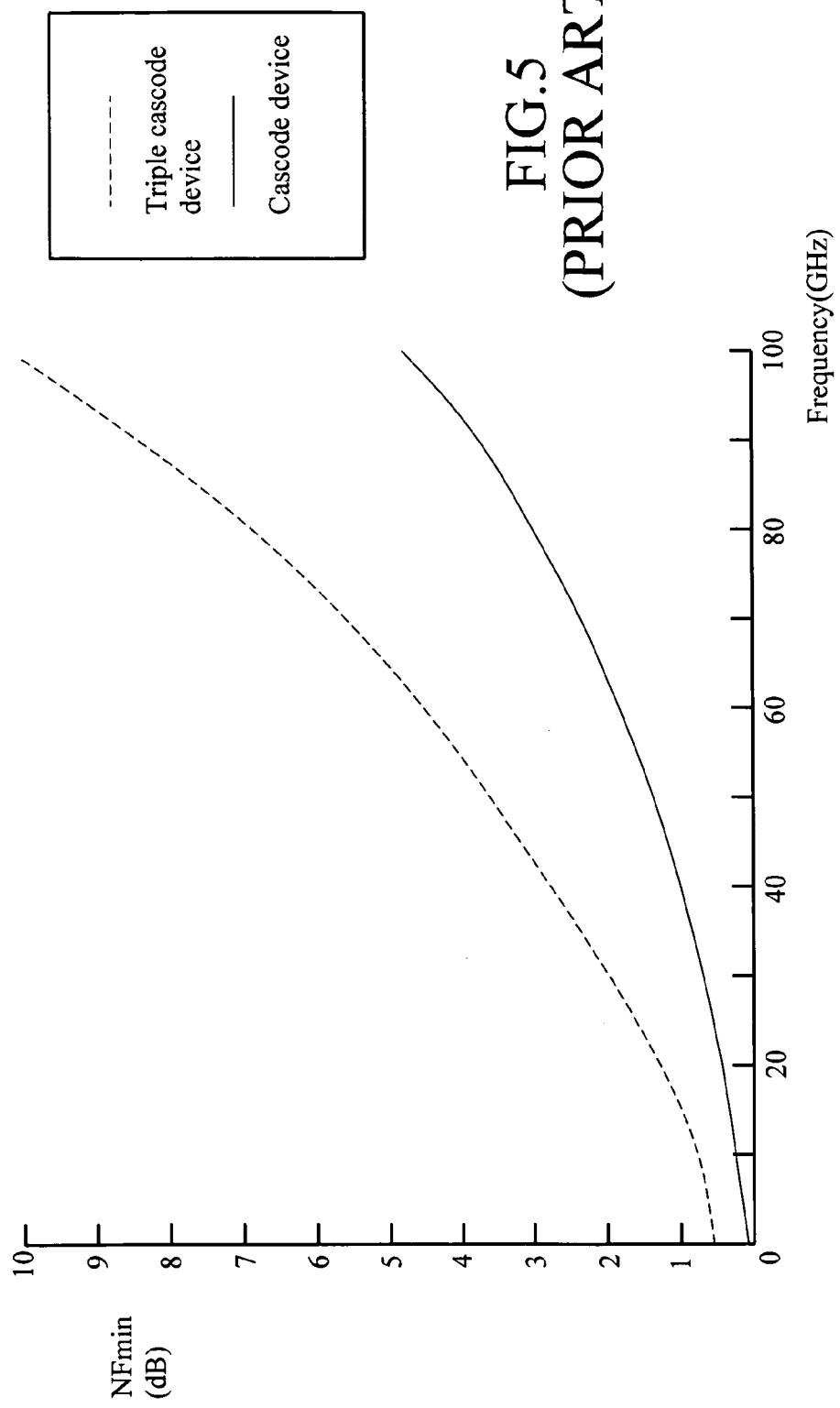
FIG. 5 is a noise-frequency diagram for a cascode device and a triple cascode device according to the prior art.

Please also refer to FIG. 3. For the triple cascode device (20) in the prior art, the parasitic capacitances of the common gate transistor M2 and M3 will cause excess noise. In the embodiment of the invention, the first inductor 331 and the second inductor 332 are provided within the low noise cascode device 30, and the first inductor 331 and the second inductor 332 are incorporated within the first parasitic capacitance Cp1, the second parasitic capacitance Cp2, the third parasitic capacitance Cp3, and the fourth parasitic capacitance Cp4 to thus become a resonator, so that the parasitic capacitances can be eliminated and the noise figure can be reduced.

The inductance L1 of the first inductor 331 and the inductance L2 of the second inductor 332 can be adjusted according to the value of the first parasitic capacitance Cp1, the second parasitic capacitance Cp2, the third parasitic capacitance Cp3, and the fourth parasitic capacitance Cp4. Furthermore, the inductance L1 of the first inductor 331 and the inductance L2 of the second inductor 331 can also be adjusted according to the operating frequency ω of the triple cascode device 300.

Figure 7:
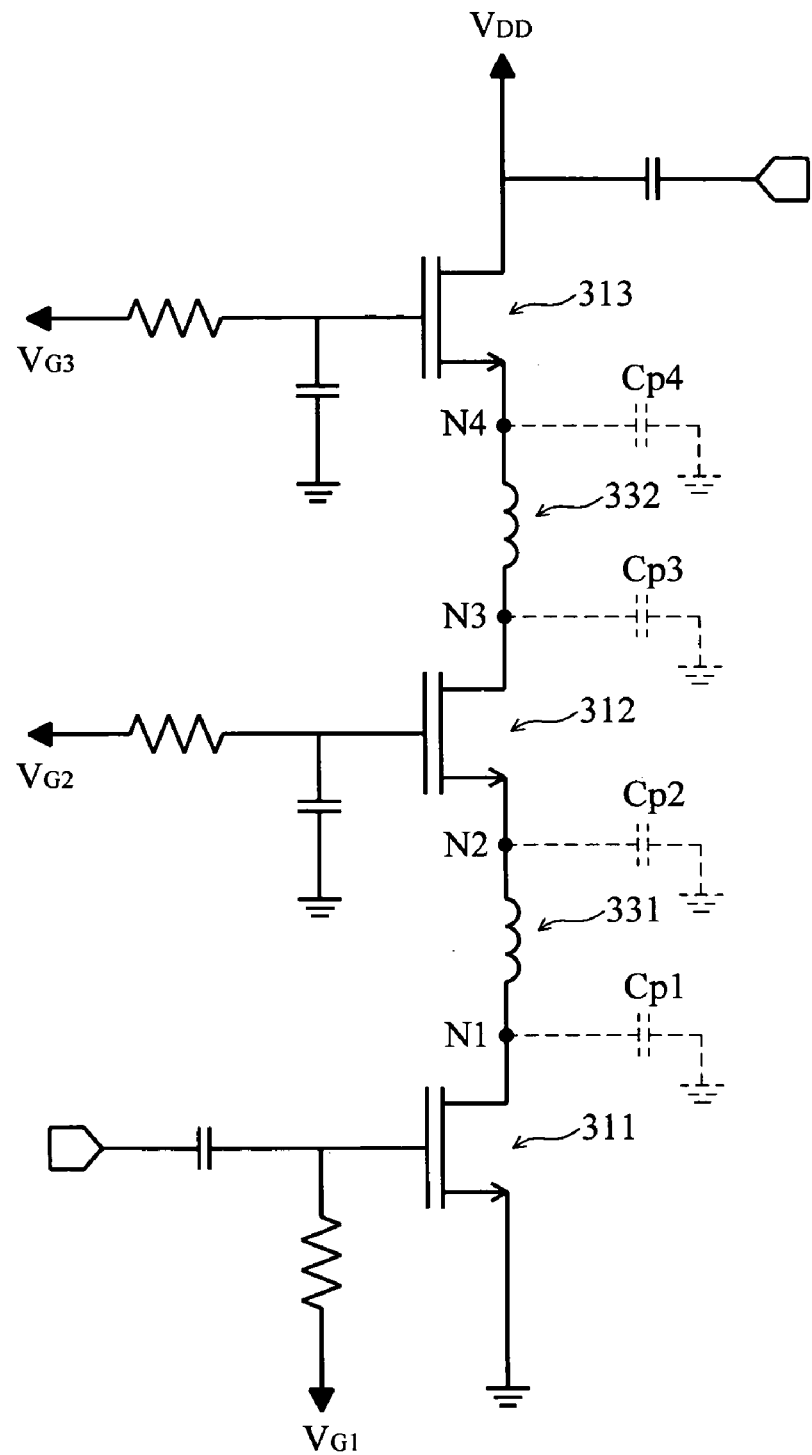
FIG. 7 is a diagram for the parasitic capacitance of the low noise cascade amplifier according to the above embodiment of the present invention.

The impedance of the node N2 in the FIG. 7 is about $$Z_{N2}=(S^2L_2C_{p3}+1)/S(C_{p3}+C_{p4}-\omega^2L_2C_{p3}C_{p4})$$

and the impedance of the node N4 is about $$Z_{N4}=(S^2L_1C_{p1}+1)/S(C_{p1}+C_{p2}-\omega^2L_1C_{p1}C_{p2})$$

Where S=jω, ω represents the operation frequency
And $L_1$ and $L_2$ meet at about $$L_1=(C_{p1}+C_{p2})/\omega^2C_{p1}C_{p2}$$

$$L_2=(C_{p3}+C_{p4})/\omega^2C_{p3}C_{p4}$$

Therefore, the noise figure of the triple cascode device 300 will be reduced because of the high impedance on the nodes N2 and N4. Moreover, the stability of the triple cascode device 300 can also be improved as a low noise amplifier.

Figure 8:
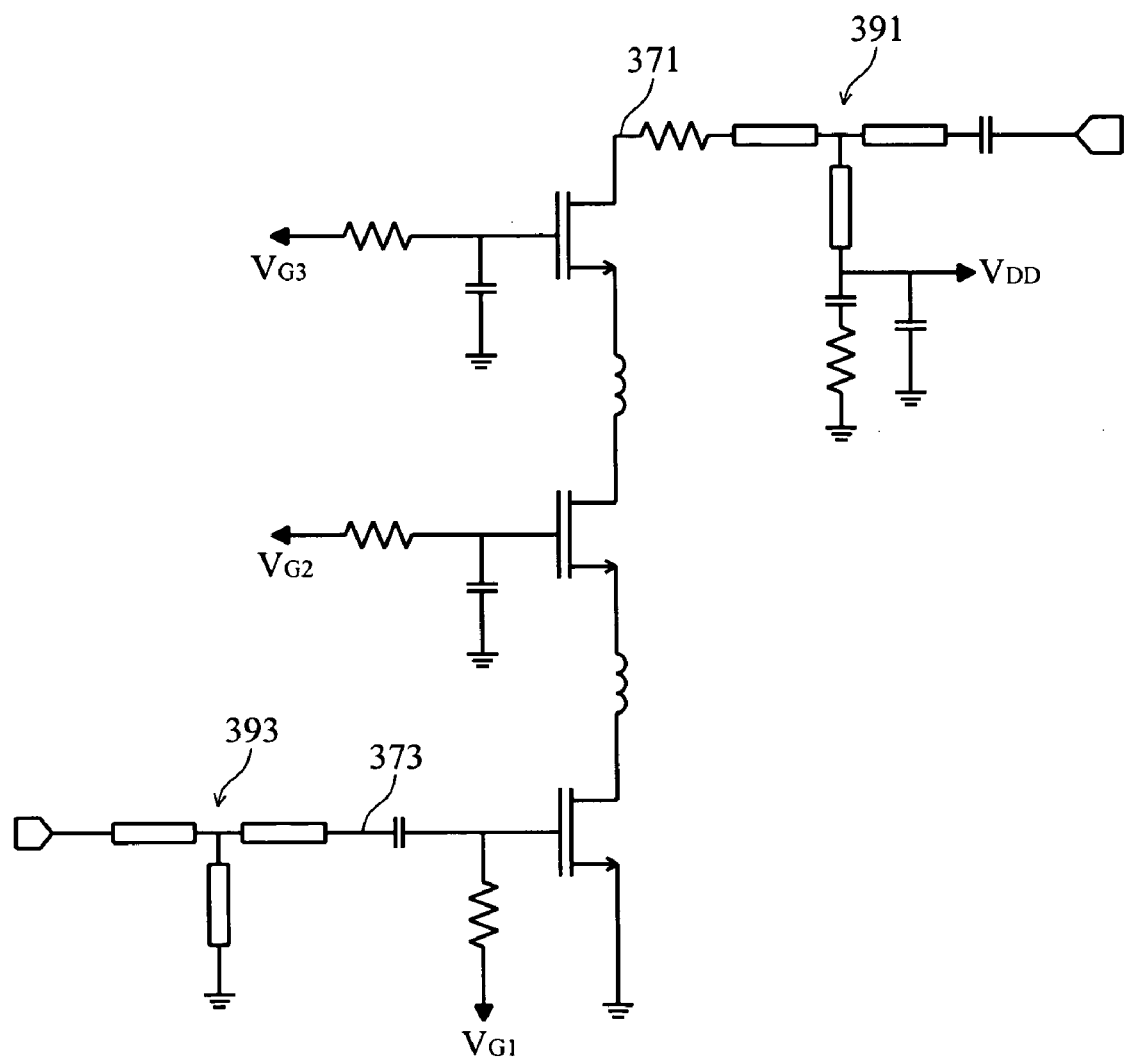
FIG. 8 is a circuit diagram for the low noise cascade amplifier according to an embodiment of the present invention.

In practical application, the gates of the first transistor 311, the second transistor 312, and the third transistor 313, can respectively connect to a first resistance 351, a second resistance 352, and a third resistance 353 to bias the gate of each transistor. In addition, a T-matching network can be utilized to simplify and implement the input and output matching circuit. For example, a first T-matching network 391 can be provided on the input terminal 371 to serve as an input impedance device and a second T-matching network 393 can be provided on the output terminal 373 to serve as an output impedance device, as shown in FIG. 8.

Figure 9:
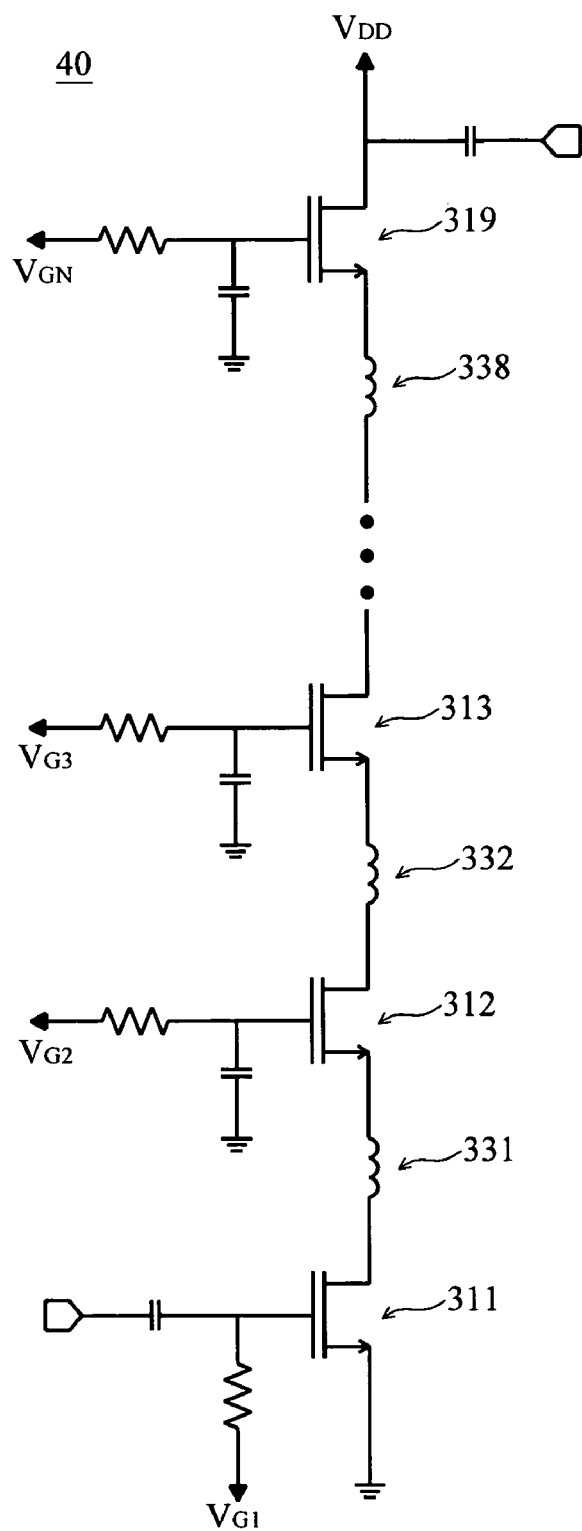
FIG. 9 is a circuit diagram for the low noise cascade amplifier according to another embodiment of the present invention.

Referring to FIG. 9, disclosed is a circuit diagram of the low noise cascode amplifier according to another embodiment of the present invention. The low noise cascode amplifier 40 comprises a first transistor 311, a second transistor 312, a third transistor 313, at least one nth transistor 319, a first inductor 331, a second inductor 332, and at least one (n−1)th inductor 338, wherein n is an integer greater than 4. The noise figure of the low noise cascode amplifier 40 can be reduced via the application of said inductors.

The first transistor 311 connects to the first inductor 331, and connects to the second transistor 312 via the first inductor 331. The second transistor 312 connects to the second inductor 332, and connects to the third transistor 313 via the second inductor 332. The third transistor 313 connects to the (n−1)th inductor 338, and connects to the nth transistor 319 via the (n−1)th inductor 338. In one embodiment of the invention, the number of the nth transistor 319 and the (n−1)th inductor 338 can be one or more than one. For example, a third inductor, a fourth transistor, an (n−1)th inductor, and an nth transistor can connect to the third transistor 338, in turn, to form an nth cascode device. The first transistor 331, the second transistor 332, the third transistor 333, and the nth transistor 319 can be the NMOS, wherein the first transistor is the common source MOS, and the second transistor 312, the third transistor 313, and the nth transistor 319 are the common gate MOS.

The above embodiments are only used to illustrate the present invention, and are not intended to limit the scope thereof. Many modifications of the above embodiments can be made without departing from the spirit of the present invention.

What is claimed is:

1. A low noise cascode amplifier, comprising:
a first transistor;
a first inductor connected to said first transistor, a first parasitic capacitance being generated between said first transistor and said first inductor;
a second transistor connected to said first inductor, a second parasitic capacitance being generated between said first inductor and said second transistor;

a second inductor connected to said second transistor, a third parasitic capacitance being generated between said second transistor and said second inductor; and a third transistor connected to said second inductor, a fourth parasitic capacitance being generated between said second inductor and said third transistor.

2. The low noise cascode amplifier of claim 1, wherein the inductance of said first inductor and said second inductor is adjusted according to the value of said first parasitic capacitance, said second parasitic capacitance, said third parasitic capacitance, and said fourth parasitic capacitance.

3. The low noise cascode amplifier of claim 2, wherein the inductance of said first inductor and said second inductor is adjusted according to the operating frequency of said amplifier.

4. The low noise cascode amplifier of claim 1, wherein the value of said first parasitic capacitance is Cp1, the value of said second parasitic capacitance is Cp2, the operating frequency of said amplifier is $\omega$, and the inductance L1 of said first inductor is approximately $(C_{p1}+C_{p2})/\omega^2 C_{p1} C_{p2}$.

5. The low noise cascode amplifier of claim 1, wherein the value of said third parasitic capacitance is Cp3, the value of said fourth parasitic capacitance is Cp4, the operating frequency of said amplifier is $\omega$, and the inductance L2 of said second inductor is approximately $(C_{p3}+C_{p4})/\omega^2 C_{p3} C_{p4}$.

6. A low noise cascode amplifier comprising:
a first transistor;
a first inductor connected to said first transistor;
a second transistor connected to said first inductor;
a second inductor connected to said second transistor;
a third transistor connected to said second inductor; and
at least one nth transistor and at least one (n−1)th inductor, wherein n is an integer equal to or greater than 4, said nth transistor being connected to said third transistor via said (n−1)th inductor.

7. The low noise cascode amplifier of claim 1, wherein the gate of said first transistor connects to a first resistance, the gate of said second transistor connects to a second resistance, and the gate of said third transistor connects to a third resistance.

8. The low noise cascode amplifier of claim 1, further comprising an input terminal that connects to a first T-matching network and an output terminal that connects to a second T-matching network.

9. A low noise cascode amplifier, comprising:
a cascode device comprising three or more transistors in series, each of said transistors having a gate connected to a resistance; and
at least one inductor positioned between said adjacent transistors, a respective parasitic capacitance being generated between each of said transistors and a corresponding inductor.

10. A low noise cascode amplifier, comprising:
a cascode device comprising three or more transistors in series;
at least one inductor positioned between said adjacent transistors, a respective parasitic capacitance being generated between each of said transistors and a corresponding inductor; and
an input terminal that connects to a first T-matching network, and an output terminal that connects to a second T-matching network.

11. A low noise cascode amplifier, comprising:
a cascode device comprising three or more transistors in series, said cascode device comprises a first transistor, a second transistor, a third transistor, and an nth transistor, wherein n is an integer equal to or greater than 4; and
at least one inductor positioned between said adjacent transistors, a respective parasitic capacitance being generated between each of said transistors and a corresponding inductor.

* * * * *